United States Patent
Felsl et al.

(10) Patent No.: US 9,412,854 B2
(45) Date of Patent: Aug. 9, 2016

(54) IGBT MODULE AND A CIRCUIT

(75) Inventors: Hans-Peter Felsl, Munich (DE); Hans-Joachim Schulze, Taufkirchen (DE); Franz-Josef Niedernostheide, Munster (DE); Thomas Raker, Unterfoehring (DE)

(73) Assignee: Infineon Technologies Austria AG, Villach (AT)

( * ) Notice: Subject to any disclaimer, the term of this patent is extended or adjusted under 35 U.S.C. 154(b) by 824 days.

(21) Appl. No.: 12/908,562

(22) Filed: Oct. 20, 2010

(65) Prior Publication Data

US 2012/0098097 A1 Apr. 26, 2012

(51) Int. Cl.
*H01L 27/082* (2006.01)
*H01L 29/739* (2006.01)
*H01L 25/07* (2006.01)

(52) U.S. Cl.
CPC .......... *H01L 29/7395* (2013.01); *H01L 25/072* (2013.01); *H01L 2924/0002* (2013.01)

(58) Field of Classification Search
CPC .............. H01L 29/7395; H01L 25/072; H01L 2924/0002

USPC ............................ 257/566, E27.017, E27.053
See application file for complete search history.

(56) References Cited

U.S. PATENT DOCUMENTS

| | | | | |
|---|---|---|---|---|
| 5,341,004 A * | 8/1994 | Furuhata | ............. | H01L 27/0716 257/138 |
| 5,770,881 A * | 6/1998 | Pelella | ............... | H01L 29/7841 257/347 |
| 6,323,717 B1 * | 11/2001 | Omura | ................... | H03K 17/12 327/403 |
| 2007/0181927 A1 * | 8/2007 | Yedinak | ............. | H01L 29/0634 257/302 |

* cited by examiner

*Primary Examiner* — Vongsavanh Sengdara
(74) *Attorney, Agent, or Firm* — Murphy, Bilak & Homiller, PLLC

(57) ABSTRACT

An IGBT module is provided. The IGBT module has at least a first individual IGBT with a first softness during switching-off the IGBT module, and at least a second individual IGBT connected in parallel to the at least one first IGBT. The at least one second individual IGBT has a second softness during switching-off the IGBT module which is different than the first softness. Further a circuit and an electronic power device having two individual IGBTs, which are connected in parallel, are provided.

14 Claims, 8 Drawing Sheets

IGBT MODULE AND A CIRCUIT

FIELD OF THE INVENTION

This specification refers to embodiments of IGBT modules and circuits having two or more IGBTs electrically connected in parallel, in particular two or more power IGBTs electrically connected in parallel.

BACKGROUND

In an IGBT (Insulated Gate Bipolar Transistor) an isolated gate FET (Field Effect Transistor) is used for control of a bipolar transistor. In so doing, low-loss and fast voltage control of the isolated gate FET is combined in a single semiconductor device with the high current and low saturation voltage $V_{CEsat}$ of the bipolar transistor. Accordingly, IGBTs are widely used in medium to high-power applications such as switching mode power supplies, inverters and traction motor controls. A single power IGBT may have a current switching capability of up to about 100 A or more and may withstand blocking voltages of up to 6 kV or more. In power applications, modules of several individual IGBTs, which are connected in parallel, can be used to reach current handling capabilities of up to several hundred amperes at high blocking voltage.

Besides blocking capability and low saturation voltage $V_{CEsat}$, switching speed and softness during switching-off, i.e. soft-recovery behavior, are important characteristics. Softness may be described in terms of overvoltages and/or voltage oscillations and/or current oscillations occurring during switching-off. In many applications these parameters can be desired to be below certain limits. However, a better softness of IGBTs may be accompanied with higher switching losses. In the current-conducting on-state, the drift region of an IGBT is flooded with a plasma of charge carriers (electrons and holes) ensuring a low saturation voltage $V_{CEsat}$. During switching-off or commutation of the IGBT, the stored charges of the plasma have to be removed again. Recombination of holes and electrons in the drift region is typically of minor importance. Accordingly, there is typically also a trade-off relationship between saturation voltage $V_{CEsat}$ and softness of IGBTs and IGBT modules, respectively.

SUMMARY

According to an embodiment, an IGBT module is provided. The IGBT module includes a first IGBT having a first semiconductor substrate, a collector electrode, a gate electrode, an emitter electrode, and a collector-side transistor with a gain factor. The collector side transistor is formed in the first substrate. The IGBT module further includes a second IGBT having a second semiconductor substrate, a collector electrode electrically connected to the collector electrode of the first IGBT, a gate electrode electrically connected to the gate electrode of the first IGBT, and an emitter electrode electrically connected to the emitter electrode of the first IGBT. The second IGBT further includes a collector-side transistor formed in the second substrate. The collector-side transistor of the second IGBT has a second gain factor which is different than the gain factor of the first IGBT.

According to an embodiment, an IGBT module is provided. The IGBT module includes at least a first IGBT and at least a second IGBT. The first IGBT includes a first semiconductor substrate and has a first softness during switching-off the IGBT module. The second IGBT includes a second semiconductor substrate and has a second softness during switching-off the IGBT module. The second softness is different than the first softness.

According to an embodiment, an electronic power device is provided. The electronic power device includes a common gate terminal, a common collector terminal, a common emitter terminal, a first IGBT and a second IGBT. The first IGBT includes a first semiconductor substrate, a first collector electrode electrically connected to the common collector terminal, a first gate electrode electrically connected to the common gate terminal, and a first emitter electrode electrically connected to the common emitter terminal. The second IGBT includes a second semiconductor substrate, a second collector electrode electrically connected to the common collector terminal, a second gate electrode electrically connected to the common gate terminal, and a second emitter electrode electrically connected to the common emitter terminal. The electronic power device further includes a first resistor and a second resistor and/or a first collector-side transistor and a second collector-side transistor and/or an external capacitor. The first resistor is connected between the common gate terminal and the first gate electrode and the second resistor is connected between the common gate terminal and the second gate electrode. The first resistor is different than the second resistor. The first collector-side transistor is formed in the first substrate as part of the first IGBT and has a first gain factor. The second collector-side transistor is formed in the second substrate as part of the second IGBT and has a second gain factor which is different than the first gain factor. The external capacitor is connected between the first gate electrode and one of the first emitter electrode and the first collector electrode or between the second gate electrode and one of the second emitter electrode and the second collector electrode.

According to an embodiment, an IGBT module is provided. The IGBT module includes a common collector terminal, a first IGBT having a first semiconductor substrate with a collector region in ohmic contact with the common collector terminal, and a second IGBT having a second semiconductor substrate with a collector region in ohmic contact with the common collector terminal. The collector region of the second IGBT has a doping concentration which is lower than the doping concentration of the collector region of the first IGBT by at least 50%.

According to an embodiment, a circuit is provided. The circuit includes at least two individual power IGBTs which are connected in parallel. A first one of the at least two individual power IGBTs has a collector-side pnp-transistor with a gain factor, and a second one of the at least two individual power IGBTs has a collector-side pnp-transistor with a gain factor which is lower by at least 10% than the gain factor of the collector-side pnp-transistor of the first IGBT.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
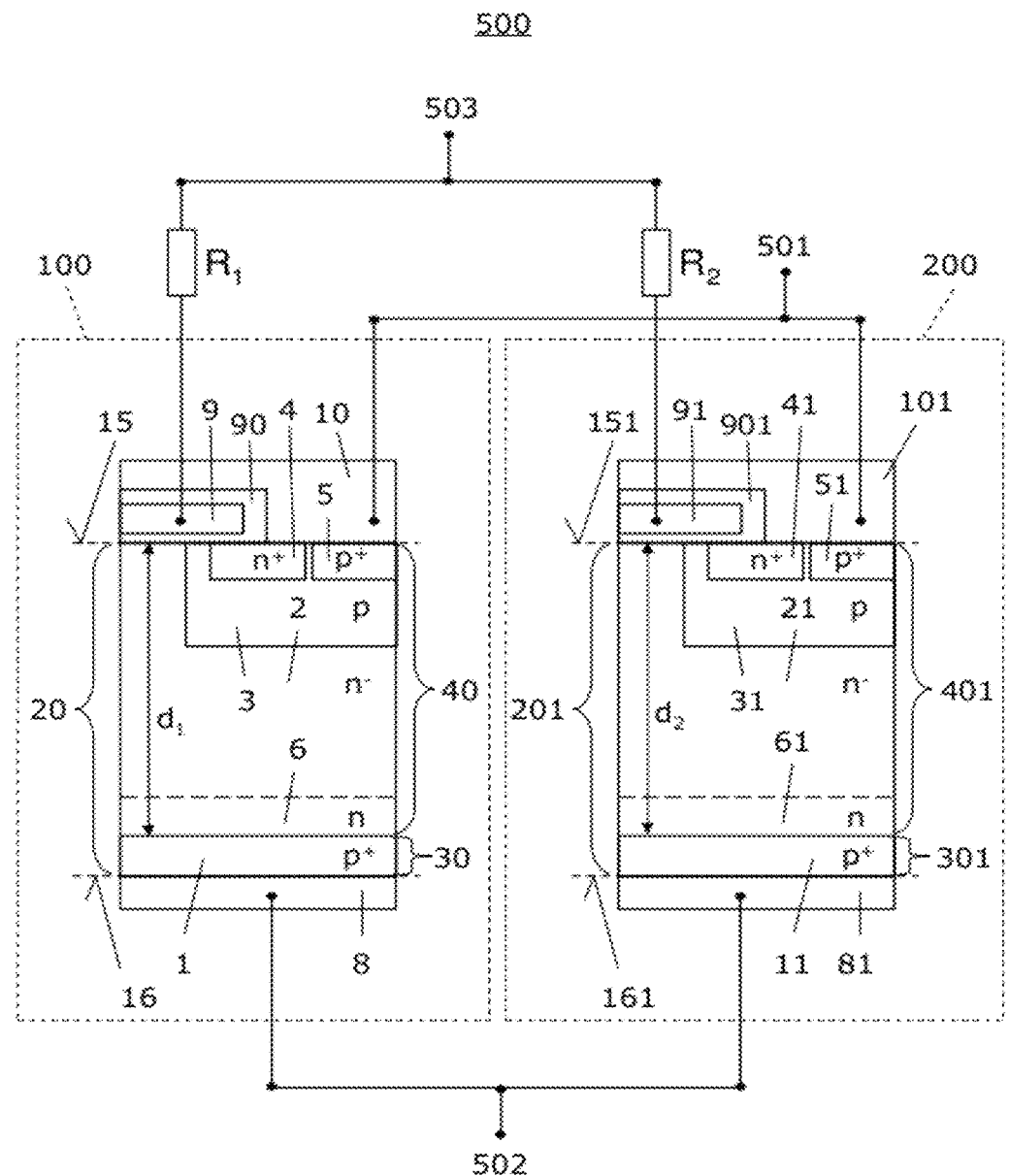
FIG. 1 schematically illustrates a vertical cross-section of an IGBT module according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, p-doped is referred to as first conductivity type while n-doped is referred to as second conductivity type. The semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$ regions can have different absolute doping concentrations. The same applies, for example, to an $n^+$ and a $p^+$ region.

Specific embodiments described in this specification pertain to, without being limited thereto, IGBT modules, in particular to power IGBT modules. The terms "IGBT" and "power IGBT" as used in this specification intend to describe an IGBT and power IGBT, respectively, on a single chip. In other words, the terms "IGBT" and "power IGBT" are used for individual devices integrated in a single semiconductor substrate. The term "power IGBT" intends to describe an IGBT with high voltage and/or high current switching capabilities. In other words, power IGBTs are intended for high current, e.g. in the Ampere range or even hundred Ampere range, and/or high voltages, e.g. above 300 V. Power IGBTs can include a plurality of IGBT structures or IGBT unit cells in an active area of the single chip.

The term "IGBT module" as used in this specification intends to describe a three terminal device with two or more individual IGBTs connected in parallel and can be arranged in a common housing. In the following, individual IGBTs are also referred to as IGBT chips. Within this specification the terms IGBT chip and individual IGBT are used synonymously. The IGBT module may include 2, 3, 4, 5, 6, 12, 24, 32, 48 or any other appropriate number of individual IGBTs. The term "IGBT module" as used in this specification shall also embrace electronic devices with two or more in parallel connected IGBT sub-modules each of which includes one or more individual IGBT which are connected in parallel.

The individual IGBTs may be vertical IGBTs or planar IGBTs. Planar and vertical IGBTs may also be combined in IGBT modules. The gate electrode of an individual IGBT may be arranged in a trench or on a main surface of the semiconductor body or chip. The individual IGBTs of an IGBT module are connected in parallel. This means that the collector electrodes of the individual IGBTs are in ohmic connection with a common collector terminal of the IGBT module, that the emitter electrodes of the individual IGBTs are in ohmic connection with a common emitter terminal of the IGBT module, and that the gate electrodes of the individual IGBTs are in ohmic connection with a common gate terminal of the IGBT module.

In the context of the present specification, the terms "in ohmic contact", "in electric contact", "in contact", "in ohmic connection", and "electrically connected" intend to describe that there is an ohmic electric connection or ohmic current path between two regions, portion or parts of a semiconductor devices or between different terminals of one or more devices or between a terminal or a metallization and a portion or part of a semiconductor device.

The individual IGBTs of an IGBT module may be mounted on a common heat-sinking base plate, for example a copper plate. Bond wires can be provided to connect the collector, emitter and gate electrodes of the individual IGBT chips with the respective common terminals of the IGBT module. The common terminals of the IGBT module can be fed through a housing, for example a molded case. The contacted individual IGBT may be casted, for example with a silicone, in the housing.

Alternatively, pressure contact technology may be used to contact the individual IGBTs of an IGBT module. For example, flexible pins may be pressed between a top plate with integrated common terminals and pad areas of the collector, emitter and gate electrodes of the individual IGBTs mounted on the common insulating plate. This type of IGBT module may also be referred to a press-pack IGBT module.

Bonding and press-pin connections may also be combined in an IGBT module. In addition, flip-chip bump connections may be used to connect the collector electrodes of individual vertical IGBT chips.

FIG. 1 illustrates an embodiment of an IGBT module 500 in a section of a vertical cross-section. In the exemplary embodiment of FIG. 1, the IGBT module includes two individual IGBTs 100 and 200. The two IGBTs 100, 200 are vertical DMOS structures in this embodiment. For sake of clarity only a portion of DMOS structures is illustrated in FIG. 1. IGBT 100 includes a semiconductor body 40 having a first or main horizontal surface 15 and a second surface 16 or back surface 16 arranged opposite to the first surface 15. Likewise, IGBT 200 includes a semiconductor body 401 having a first or main horizontal surface 151 and a second surface 161 or back surface 161 arranged opposite to the first surface 151. Semiconductor body 401 is separate to semiconductor body 40.

The semiconductor bodies 40, 401 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

Semiconductor body 40 of the first IGBT 100 includes a p-type first semiconductor region 1 which extends to the back surface 16 and can form a collector region 1 in contact with a collector electrode 8 or collector metallization 8. An n-type second semiconductor region 2 is arranged between the first semiconductor region 1 and the main horizontal surface 15. A pn-junction is arranged between the first semiconductor region 1 and the second semiconductor region 2. A p-type third semiconductor region 3 forms a further pn-junction with the second semiconductor region 2 and is in ohmic contact via a $p^+$-type fifth semiconductor region 5 with a metallization 10 arranged on the main horizontal surface 15. Metallization 10 is further in ohmic contact with an $n^+$-type fourth semiconductor region 4 which is at least partially embedded in the third semiconductor region 3. A further metallization or conducting layer 9 is arranged on main horizontal surface 15 and insulated from the semiconductor body 40 by an insulating region 90. Second, third, fourth and fifth semiconductor regions 2, 3, 4, 5 can form a drift region 2, a body region 3, a source region 4 and a body contact region 5, respectively. Metallizations 9 and 10 can form a gate electrode 9 and an emitter electrode 10, respectively.

Likewise, semiconductor body 401 of the second IGBT 200 includes a p-type first semiconductor region 11 which extends to the back surface 161 and can form a collector region 11 in contact with a collector electrode 81 or collector metallization 81. An n-type second semiconductor region 21 is arranged between the first semiconductor region 11 and the main horizontal surface 151. A pn-junction is arranged between the first semiconductor region 11 and the second semiconductor region 21. A p-type third semiconductor region 31 forms a further pn-junction with the second semiconductor region 21 and is in ohmic contact via a $p^+$-type fifth semiconductor region 51 with a metallization 101 arranged on the main horizontal surface 151. Metallization 101 is further in ohmic contact with an $n^+$-type fourth semiconductor region 41 which is at least partially embedded in the third semiconductor region 31. A further metallization or conducting layer 91 is arranged on main horizontal surface 151 and insulated from the semiconductor body 401 by an insulating region 901. Second, third, fourth and fifth semiconductor regions 21, 31, 41, 51 can form a drift region 21, a body region 31, a source region 41 and a body contact region 51, respectively. Metallizations 91 and 101 can form a gate electrode 91 and an emitter electrode 101, respectively.

In the exemplary embodiment illustrated in FIG. 1, the IGBTs 100 and 200 are DMOS-IGBTs with gate electrodes 9, 91 arranged on the respective semiconductor body 40, 401. In other embodiments, the gate electrode 9 and/or the gate electrode 91 are arranged in respective trenches extending into the respective semiconductor bodies 40, 401. In further embodiments at least one of the IGBTs 100 and 200 is a planar IGBT.

The doping relations of the semiconductor regions illustrated in FIG. 1 may also be reversed. In addition, further semiconductor regions may be arranged between the first semiconductor region 1 and the second semiconductor region 2. The first and/or the second IGBT 100, 200 may further include an optional n-type sixth semiconductor region 6, 61 which can form a field-stop region as indicated by the dashed lines. In some embodiments, the field-stop regions 6, 61 are also referred to as buffer region 6, 61. In other words, the first and/or the second IGBT 100, 200 may be formed as punch through IGBTs or as non-punch through IGBTs.

The gate electrode 9 of the first IGBT 100 and the gate electrode 91 of the second IGBT 200 are electrically connected to a common gate terminal 503 of the IGBT module 500. The collector electrode 8 of the first IGBT 100 and the collector electrode 81 of the second IGBT 200 are electrically connected to a common collector terminal 502 of the IGBT module 500. Further, the emitter electrode 10 of the first IGBT 100 and the emitter electrode 101 of the second IGBT 200 are electrically connected to a common emitter terminal 501 of the IGBT module 500. Accordingly, device 500 forms a three-terminal electronic device 500, e.g. a three-terminal power electronic device 500.

The IGBTs 100 and 200 can be power semiconductor devices. In this case, a plurality of respective unit cells is arranged in respective active areas of the power semiconductor device 100, 200. Accordingly, IGBT module 500 can be an electronic power device or part of an electronic power device such as a dc-to-dc converter, an ac-to-ac converter or an inverter. IGBT module 500 may also operate in a switching mode power supply or a traction motor control. Depending on rated power and/or current, a plurality of individual IGBTs 100 and 200 may be connected in parallel in a single IGBT module. Alternatively or in addition, several IGBT sub-modules may by connected in parallel to form a three-terminal electronic power device. In other words, the electronic power device includes a circuit with at least two individual IGBTs 100 and 200, e.g. a plurality of power IGBTs 100 and 200, which are connected in parallel.

According to an embodiment, a first resistor $R_1$ and a second $R_2$ having a different resistance value than the first resistor $R_1$ are arranged between the common gate terminal 503 and the gate electrodes 9 and 91, respectively. The first resistor $R_1$ is connected between gate terminal 9 of the first IGBT 100 and the common gate terminal 503. The second resistor $R_2$ is connected between gate terminal 91 of the second IGBT 200 and the common gate terminal 503. In so doing, the charging and discharging time of the gate electrodes 9, 91 may be adjusted. Accordingly, the time constants and softness during switching-off of the first and second IGBT 100 and 200 may be different even when the IGBTs 100 and 200 have substantially equal characteristics. For example, the second resistor $R_2$ is about zero, i.e. represents the small line resistance, and the first resistor $R_1$ is chosen such that the charging time of the capacitor formed between the gate electrode 9 and semiconductor body 40 of the first IGBT 100 is increased by at least about 10%, e.g. by at least 25% compared to the charging time of the capacitor formed between the gate electrode 91 and semiconductor body 401 of the second IGBT 200. When the IGBT module 500 is switched off, switching-off of first IGBT 100 will be slightly prolonged compared to second IGBT 200. As a result, overvoltages as well as voltage and current oscillations during switching-off of IGBT module 500 maybe avoided or at least reduced. In other words, the softness of IGBT module 500 is improved.

The ratio between the resistance of the second resistor $R_2$ and the resistance of the first resistor $R_1$ can be larger than 1.2 for IGBTs 100 and 200 with about the same gate capacitance.

Alternatively or in addition, the charging time of the gate capacitors may be adjusted by connecting external capacitors between at least one of the gate electrodes 9, 91 and the respective emitter electrode 10, 101 and/or respective collector electrode 8, 81. This is explained in more detail with respect to FIGS. 3 and 4 below.

Alternatively or in addition, the switching-off characteristics of the IGBTs 100 and 200 are adjusted by geometry and/or doping relation and/or lifetime of charge carriers of the respective semiconductor regions.

According to an embodiment, the switching-off characteristics, in particular the softness of the first and second IGBT 100, 200 is chosen such that the softness during switching-off of IGBT module 500 is improved. Switching-off softness of an IGBT or an IGBT module can be considered for given circuitry, e.g. for a given inductive load connected to the IGBT or IGBT module. Within this specification the terms "switching-off softness" and softness are used synonymously. Depending on application, softness may be determined in terms of fall time, voltage characteristics such as overvoltage or voltage oscillations occurring during switching-off. Softness may, however, also be determined in terms of current characteristics or any combination of voltage and current characteristics. For example, a softness factor characterizing the softness during switching-off or the soft-recovery behavior of a device or circuit may be defined as the ratio of reverse recovery current fall time $t_b$ to the reverse recovery current rise time $t_a$. This ratio is also known as "recovery softness factor" as given by:

$$S_{RSF} = t_b/t_a.$$

Often the so called "reverse recovery softness factor" $S_{RRSF}$ gives a better measure for the switching-off softness. It is defined as the absolute value of the ratio of the rate of rise of the reverse recovery current i when the current i is passing through zero at the beginning of the reverse recovery time to the maximum value of the rate of fall of the reverse recovery current i after the current has passed through its peak value as given by:

$$S_{RRSF} = \frac{\left|\frac{di}{dI}\big|_{i=0}\right|}{\left|\frac{di}{dI}\big|_{max}\right|}.$$

The same definition or measure for the softness factor is used for the individual IGBTs of an IGBT module.

The softness factors of the first and second IGBTs 100, 200 can differ by at least 10%, e.g. by at least 20%.

According to embodiments, individual IGBTs of more than two IGBTs-types which differ with respect to their softness are connected in parallel. For example, one or more first IGBTs having a first softness factor, are connected in parallel with one or more second IGBTs having a second softness factor and one ore more third IGBTs having a third softness factor, wherein the second softness factor is smaller than the first softness factor and the third softness factor is smaller than the second softness factor. In so doing, the trade-off relationship between the switching losses, the saturation voltage and the softness of the IGBT module may be further improved.

The softness of IGBT chips 100, 200 further depend on geometry, arrangement and doping concentrations of semiconductor regions. According to an embodiment, the collector region 1 of the first IGBT 100 has a doping concentration that differs from that of the collector region 11 of the second IGBT 200. In so doing, the efficiency of emitting holes from the collector region 1, 11 into the respective drift region 2, 21 or the respective optional field-stop region 6, 61 is different for the two IGBTs 100, 200. In other words, the IGBTs 100 and 200 can have different backside emitter efficiencies. This results in a different softness of the two IGBTs 100, 200.

The doping concentration of the collector regions 1 and 11 can differ by at least 20%, e.g. by at least 50%. In other words, the IGBT module 500 can include a common collector terminal 502, a first IGBT 100 having a first semiconductor substrate 30 with a collector region 1 in ohmic contact with the common collector terminal 502, and a second IGBT 200 having a second semiconductor substrate 301 with a collector region 11 in ohmic contact with the common collector terminal 502. The collector region 1 of the first IGBT 100 has a doping concentration which exceeds the doping concentration of the collector region 11 of the second IGBT 200 by at least 20%, e.g. by at least 50%.

Compared to an IGBT module with identical IGBTs but having locally enhanced backside emitters, e.g. a structured collector region with sub-regions of different doping concentrations, the production costs of IGBT modules 500 with individual IGBTs 100, 200 of different backside emitter efficiency can be lower as the structuring of the collector region is avoided. Furthermore, the plasma above the differently doped emitter regions interacts with each other during device operation. Accordingly, it can be easier to adjust the softness of individual IGBTs 100, 200 than to adjust the doping relations and/or arrangement of sub-regions of IGBTs with locally enhanced backside emitters for different applications.

According to an embodiment, the doping concentration of the drift region 2 of the first IGBT 100 differs from the doping concentration of the drift region 21 of the second IGBT 200. Accordingly, the softness of IGBTs 100 and 200 can be different. For example, the drift regions 2, 21 of the IGBTs 100, 200 form a pn-junction with the respective collector regions 1, 11 and the doping concentration of the drift region 22 of the second IGBT 200 is only about 75%, e.g. only about 50% or even less than the doping concentration of the drift region 2 of the first IGBT 100.

According to an embodiment, a minimum distance $d_1$ between the emitter electrode 10 or the gate dielectric 90 and the collector region 1 of the first IGBT 100 is different than a minimum distance $d_2$ between the emitter electrode 101 or the gate dielectric 901 and the collector region 11 of the second IGBT 200. This can also result in different softness of the IGBTs 100, 200 and thus in an improved trade-off relationship between the switching losses, the saturation voltage and the softness of the IGBT module 500. The minimum distance $d_1$ and $d_2$ can differ by at least 5%, e.g. by at least 10%.

According to an embodiment, one of the IGBTs 100, 200 has a higher or highly doped field-stop layer 6, 61 which is arranged between the respective collector region 1, 11 and the respective drift region 2, 21 having a lower doping concentration. This can also result in different softness of the IGBTs 100, 200 and thus in an improved trade-off relationship between the switching losses, the saturation voltage and the softness of the IGBT module 500. In case of vertical IGBTs, the minimum distances $d_1$ and $d_2$ may correspond to the vertical extension of drift region 2 and drift region 21, respectively. The minimum distances may, however, also correspond to a shortest current path through the drift region.

According to an embodiment, both IGBTs 100, 200 have a respective field-stop layer 6, 61 which is arranged between the respective collector region 1, 11 and the respective drift region 2, 21 having a lower doping concentration than the adjoining field-stop region 6, 61. In this embodiment, the doping concentrations of the field-stop-layers 6, 61 can be different. This can also result in different softness of the IGBTs 100, 200 and thus in an improved trade-off relationship between the switching losses, the saturation voltage and the softness of the IGBT module 500. For example, the maximum doping concentration of field-stop region 1 of the first IGBT 100 is in a range from about $5*10^{14}$ cm$^{-3}$ to about $5*10^{16}$ cm$^{-3}$ and the maximum doping concentration of field-stop region 61 of the second IGBT 200 is only about 50% of the maximum doping concentration of field-stop region 6 of the first IGBT 100.

The field-stop regions 6 and 61 may also have different vertical extensions to achieve different softness of the IGBTs 100, 200. For example, the field-stop regions 6 and 61 may have the same maximum doping concentration but vertical extensions which differ by about 30% or more.

Doping concentrations and geometry of drift regions 2, 21 and/or field-stop regions 6, 61 can be chosen such that the resistivity of the current path through the n-doped regions of the first IGBT 100 and the second IGBT 200 differ by at least 10%, e.g. by at least 20% or by even at least 50%.

FIG. 1 illustrates vertical cross-sections of the active area for carrying a load current of two IGBTs 100, 200. According to an embodiment, the size of the active area of the first IGBT 100 is in a range from about 5% to about 2000% of the size of the active area of the second IGBT 200. The size of the active area of the second IGBT 200 can be in a range from about 150% to about 400% of the size of the active area of the first IGBT 100 having a better softness than the second IGBT 200. In so doing, the current during switching-off may be balanced between the two IGBTs 100 and 200 such that the softness of the IGBT module is further improved.

Several first and/or second IGBTs 100, 200 may be connected in parallel to adjust the above mentioned size ratio of active areas instead of using a single first IGBT 100 and a single second IGBT 200 of appropriate size. For example, one first IGBT 100 and two second IGBTs 200, or four first IGBTs 100 and eight second IGBTs 200 with approximately the same size of active areas may be connected in parallel to obtain a size ratio of total active area of about 2. The size ratio of total active areas of about 2 may also be obtained in an IGBT module 500 with two first IGBTs 100 and two second IGBTs 200, or with six first IGBTs 100 and six second IGBTs 200, wherein each of the second IGBTs 200 has a size of its active area which is about twice the size of the active area of each of the first IGBTs 100. Other examples of IGBT modules 500 include, without being limited thereto, two first IGBTs 100 and three, four or eight second IGBTs 200. A given size ratio may also be obtained by connecting in parallel an equal number of first and second IGBTs 100, 200, for example six first IGBTs 100 and six second IGBTs 200, but of different total active area. The total active area of the second IGBTs 200 can be larger than the total active area of the first IGBTs 100.

Figure 2:
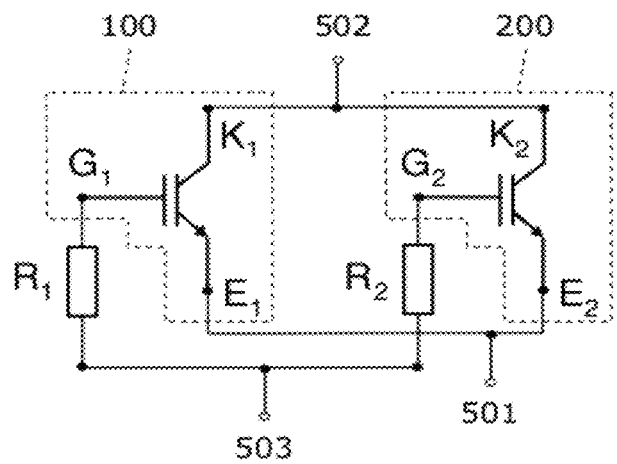
FIG. 2 schematically illustrates a circuit diagram according to one or more embodiments.
Figure 2:
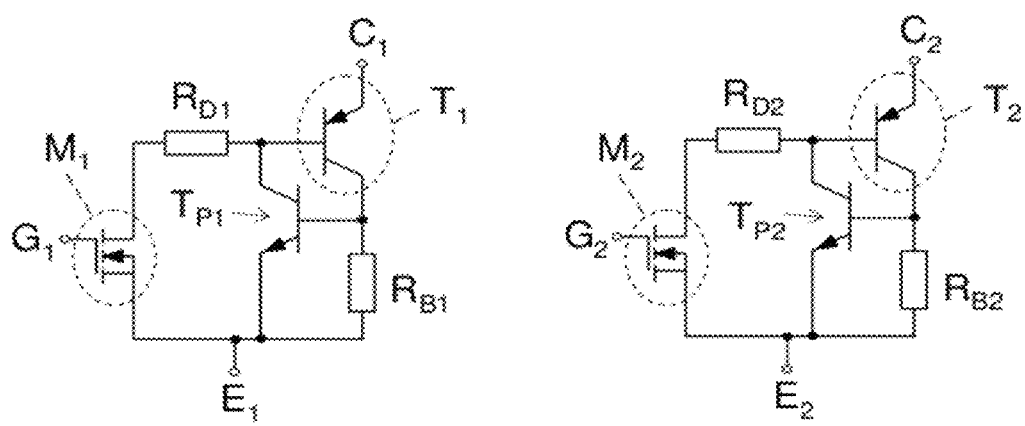

FIG. 2 schematically illustrates a circuit diagram 510 according to one or more embodiments. The upper drawing illustrates an equivalent circuit diagram 510 of an IGBT module 510 with two individual IGBTs 100, 200. The circuit diagram 510 may e.g. correspond to the IGBT module 500 illustrated in FIG. 1. Accordingly, individual terminals $K_1$, $E_1$ and $G_1$ correspond to the collector electrode 8, emitter electrode 10 and gate electrode 9 of the first IGBT 100 illustrated in FIG. 1, and individual terminals $K_2$, $E_2$ and $G_2$ correspond to the collector electrode 81, emitter electrode 101 and gate electrode 91 of the second IGBT 200 illustrated in FIG. 1. The individual gate terminals $G_1$ and $G_2$ are electrically connected to the common gate terminal 503 of IGBT module 510. The individual terminals $E_1$ and $E_2$ are electrically connected to the common emitter terminal 501 of IGBT module 510 and the individual terminals $K_1$ and $K_2$ are electrically connected to the common collector terminal 502 of IGBT module 510.

Note that the IGBTs 100, 200 in FIG. 2 may also represent several individual IGBTs 100, 200 which are connected in parallel. Circuit diagram 510 may therefore also correspond to an IGBT module having IGBT sub-modules 100, 200 each of which includes one ore more individual IGBTs.

According to an embodiment, the resistance between the first individual gate terminals $G_1$ or first gate electrode and the common gate terminal 503 exceeds the resistance between the second individual gate terminals $G_2$ or gate electrode and the common gate terminal 503.

The lower drawings of FIG. 2 illustrate more detailed equivalent circuit diagrams of the IGBT 100 and 200. Both IGBTs include a MOSFET $M_1$ and $M_2$, respectively, a collector-side transistor $T_1$ and $T_2$, respectively, and a parasitic transistor $T_{p1}$ and $T_{p2}$, respectively. The collector-side transistors $T_1$, $T_2$ form with their respective parasitic transistor $T_{p1}$, $T_{p2}$ parasitic thyristors of the IGBT 100 and IGBT 200, respectively. In the exemplary embodiment of FIG. 2, the collector-side transistors $T_1$ and $T_2$ are pnp-transistors. The resistors $R_{B1}$ and $R_{B2}$ represent the resistance of the body region of the first IGBT 100 and the second IGBT 200, respectively. The resistors $R_{D1}$ and $R_{D2}$ represent the resistance of the drift region of the first IGBT 100 and the second IGBT 200, respectively.

According to an embodiment, the gain factor ($\alpha_{pnp}$) of the collector-side transistor $T_1$ of the first IGBT 100 is different to the gain factor ($\alpha_{pnp}$) of the collector-side transistor $T_2$ of the second IGBT 200. Accordingly, the softness of the first and second IGBT 100, 200 differs. Thus, the trade-off relationship between the switching losses, the saturation voltage and the softness of the circuit 510 representing e.g. an IGBT module may be improved. Within this specification the phrase that two gain factors of transistors differ intends to describe that the difference between the gain factors, under same operating conditions of the transistors, are greater than expected from manufacturing variations and variations due to aging processes. This means that the two gain factors differ by more than about 1% to 5%. For example, the gain factor of the collector-side transistor $T_2$ of the second IGBT 200 is lower than the gain factor of collector-side transistor $T_1$ of the first IGBT 100 by more than 5%. The gain factors of the collector-side transistors $T_1$ and $T_2$ in the IGBT module can differ by more than about 10%, e.g. by more than about 25%. The gain factors may depend on operating conditions. The gain factors of the collector-side transistors $T_1$ and $T_2$ can differ by more than about 10%, e.g. by more than about 25% at typical operating condition, in particular at rated current of the IGBTs 100 and 200.

More than two different individual IGBTs may be connected in parallel and that several individual IGBTs with the same gain factor of their collector-side transistors may be connected in parallel instead of the illustrated one first IGBT 100 and one second IGBT 200 in the circuit 510 of FIG. 2. Furthermore, the IGBTs 100 and 200 can be power IGBTs. In other words, the circuit 510 can include at least two individual power IGBTs 100, 200 which are connected in parallel. The first individual power IGBT 100 has a collector-side pnp-transistor $T_1$ with a gain factor, and the second individual power IGBT 200 has a collector-side pnp-transistor $T_2$ with a gain factor which differs from the gain factor of the collector-side pnp-transistor $T_1$ of the first IGBT 100 by at least 10%, e.g. by at least 25%.

The gain factors of the collector-side transistors $T_1$ and $T_2$ may be adjusted by the doping relations of the semiconductor regions of the first IGBT 100 and the second IGBT 200, respectively. For example, a higher doping concentration of the collector region corresponds to a higher gain factor of the collector-side transistor. This in turn can also reduce the saturation voltage between the collector electrode and its emitter electrode of the IGBT. In other words, the saturation voltages of the IGBTs 100, 200 can be different.

According to an embodiment, the first individual IGBT 100 has a p-type collector region as part of its collector-side pnp-transistor $T_1$, and the second individual IGBT 200 has a p-type collector region as part its collector-side pnp-transistor $T_2$, wherein the doping concentrations of the collector region of the second individual IGBT 200 is different to, for example lower than, the doping concentration of the collector region of the first IGBT 100.

According to an embodiment, both individual IGBTs 100, 200 are vertical IGBTs having respective drift regions but of different vertical extension and/or doping concentration. For example, the vertical extension of the first individual IGBT 100 is larger, e.g. by at least 5%, or e.g. by at least 10% than the vertical extension of the drift region of the second IGBT 200.

Figure 3:
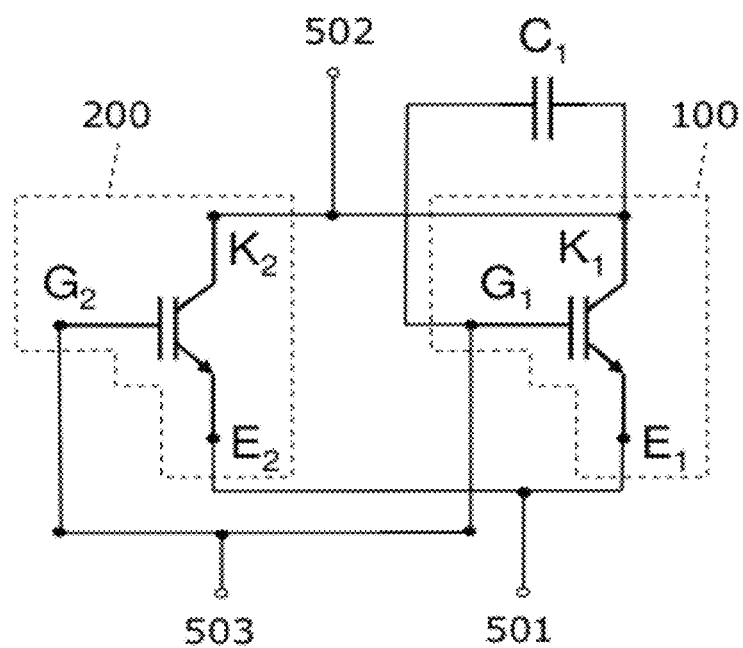
FIG. 3 schematically illustrates a circuit diagram according to one or more embodiments.

FIG. 3 schematically illustrates a circuit diagram 520 according to an embodiment. Circuit diagram 520 is similar to circuit diagram 510 illustrated in FIG. 2 and may also represent an equivalent circuit diagram of an IGBT module or a part thereof. However, an external capacitor $C_1$ is connected between the individual gate terminals $G_1$ and the individual collector terminal $K_1$ of the first IGBT 100 instead of different resistors as illustrated in FIG. 2. In so doing, the charging and discharging time of the gate electrodes of the first individual IGBT 100 is increased. Accordingly, the time constants and softness during switching-off the first and second IGBT 100 and 200 can be different and chosen such that the trade-off relationship between the switching losses, the saturation voltage and the softness of the device represented by the circuit diagram 520 is improved. In another embodiment, both individual IGBTs have a respective external capacitor connected between the respective individual gate and collector terminal. Additional resistors as explained with reference to FIG. 2 may further be provided.

Figure 4:
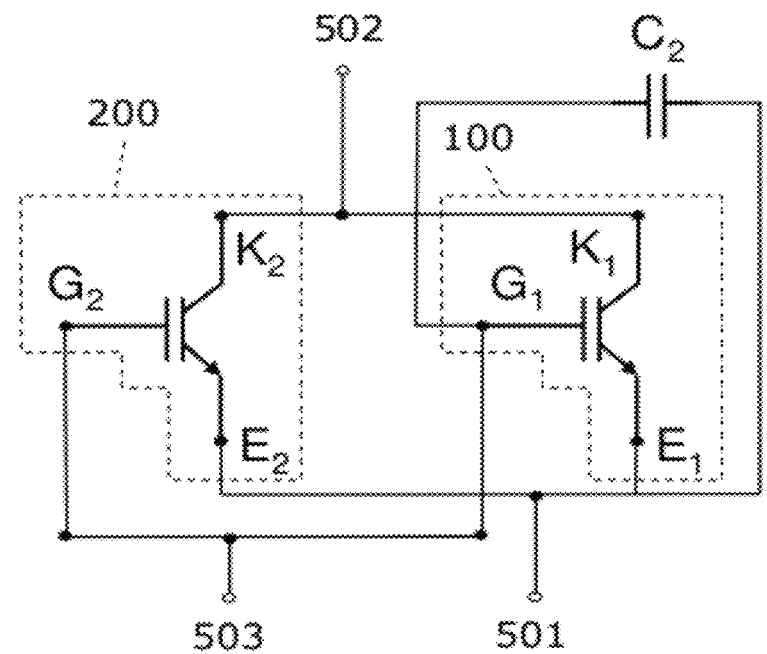
FIG. 4 schematically illustrates a circuit diagram according to one or more embodiments.

FIG. 4 schematically illustrates a circuit diagram 530 according to an embodiment. Circuit diagram 530 is similar to circuit diagram 510 illustrated in FIG. 2 and may also represent an equivalent circuit diagram of an IGBT module or a part thereof. However, an external capacitor $C_2$ is connected between the individual gate terminals $G_1$ and the individual emitter terminal $E_1$ of the first IGBT 100 instead of different resistors as illustrated in FIG. 2. In so doing, the charging and discharging time of the gate electrodes of the first individual IGBT 100 is increased. Accordingly, the time constants and softness during switching-off the first and second IGBT 100 and 200 can be different and chosen such that the trade-off relationship between the switching losses, the saturation voltage and the softness of the device represented by the circuit diagram 530 is improved. In another embodiment, both individual IGBTs have a respective external capacitor of different capacitance connected between the respective individual gate and emitter terminal. Additional resistors as illustrated in FIG. 2 and or an additional capacitor between the individual gate terminals $G_1$ and the individual collector terminal $K_1$ as explained with reference to FIG. 3 may further be provided.

Figure 5:
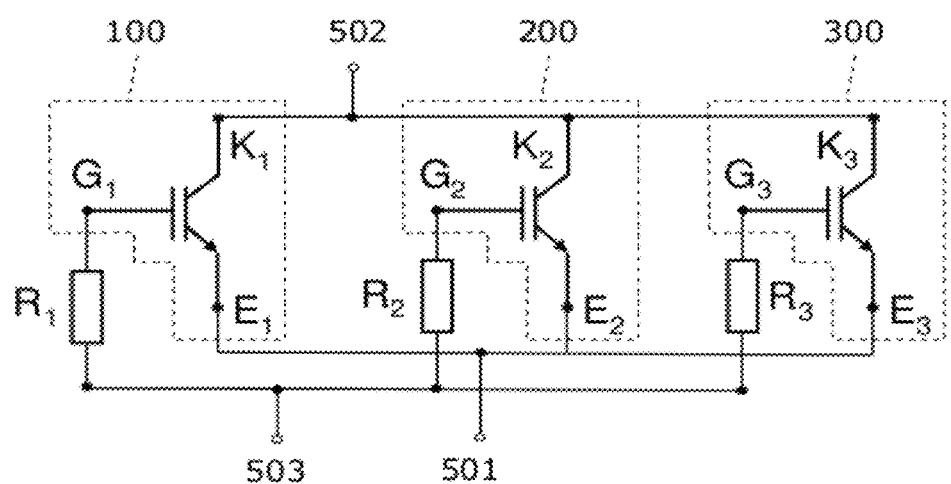
FIG. 5 schematically illustrates a circuit diagram according to one or more embodiments.

FIG. 5 schematically illustrates a circuit diagram 540 according to an embodiment. Circuit diagram 540 is similar to circuit diagram 510 illustrated in FIG. 2 and may also represent an equivalent circuit diagram of an IGBT module or a part thereof. However, in the exemplary embodiment illustrated in FIG. 5, three IGBTs or IGBT sub-modules 100, 200 and 300 are connected in parallel. Three resistors $R_1$, $R_2$, $R_3$ are connected between the common gate terminal 503 and the respective individual gate terminals $G_1$, $G_2$, $G_3$. The three resistors $R_1$, $R_2$, $R_3$ may be different. Accordingly, the softness of the three IGBTs or IGBT sub-modules 100, 200 and 300 can be different and chosen such that the trade-off relationship between the switching losses, the saturation voltage and the softness of the device represented by the circuit diagram 540 is improved. Similar circuits with external capacitors as explained with reference to FIGS. 3 and 4 may also be provided.

Figure 6:
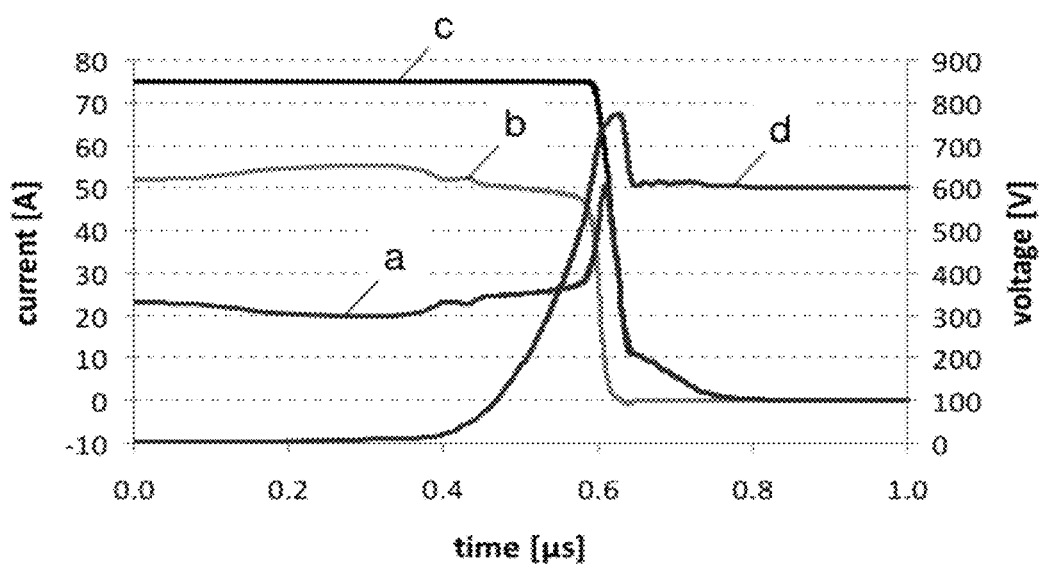
FIG. 6 schematically illustrates the switching-off behavior of an IGBT module according to one or more embodiments.

FIG. 6 schematically illustrates the switching-off behavior of an IGBT module. The exemplary IGBT module has two individual IGBTs which are connected in parallel. The two IGBTs are substantially identical except for the doping concentration of their respective collector region which differ by about 100%. The curves a to d were obtained from a device simulation. Curve a and b correspond to the current of the IGBT with a higher doped collector region and to the current of the IGBT with the lesser doped collector region, respectively. Accordingly, the IGBT corresponding to curve b faster switches off. Curve c corresponds to the total current of the IGBT module. Curve d represents the voltage between collector and emitter $V_{CE}$ which is identical for both IGBTs and the IGBT module. As can be seen from the curves a to c around the time of 0.6 µs, the IGBT with the higher doped collector region (curve a) carries a higher portion of the total current when the IGBT with the lesser doped collector region switches off. This avoids heavy overshooting and oscillations of total current (curve c) and voltage $V_{CE}$ (curve d) during switching-off the IGBT module. Thus, a very good softness or reverse recovery behavior of the IGBT module is achieved.

Figure 7:
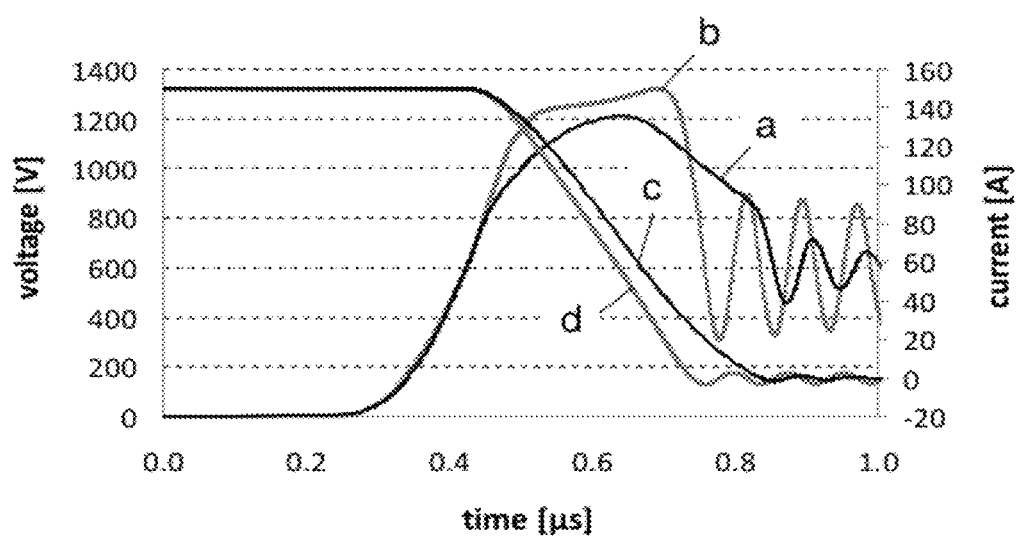
FIG. 7 schematically illustrates switching-off behavior of an IGBT module according to one or more embodiments.

FIG. 7 schematically illustrates the switching-off behavior of an IGBT module under extreme switching conditions. The illustrated curves were obtained in a simulation for an IGBT module with individual IGBTs, i.e. IGBTs integrated in separate semiconductor substrates, (curves a and c) and an integrated IGBT with two IGBTs which are integrated in a single semiconductor body (curves b and d). The IGBT module includes a first individual IGBT with comparatively high doping concentration of its collector region and a second individual IGBT with comparatively low doping concentration of its collector region. The ratio of the doping concentration is about 2. The two IGBT-structures of the integrated IGBT have the same electronic properties as the individual IGBT when considered as isolated devices. The integrated IGBT is, however, constructed as an IGBT with locally enhanced backside emitter. Accordingly, local coupling on the chip level between the two IGBT-structures cannot be completely avoided. Thus, the softness or reverse-recovery behavior of the integrated IGBT and the IGBT module can be different. As can be inferred from FIG. 7, both the current (curve c) and the voltage (curve a) of the IGBT module show significantly lower damped oscillations than the current (curve d) and the voltage (curve b) of the integrated IGBT. Individual IGBTs which are connected in parallel can allow an improved softness compared to a similar integrated IGBT-structure but integrated into a single semiconductor substrate.

Figure 8:
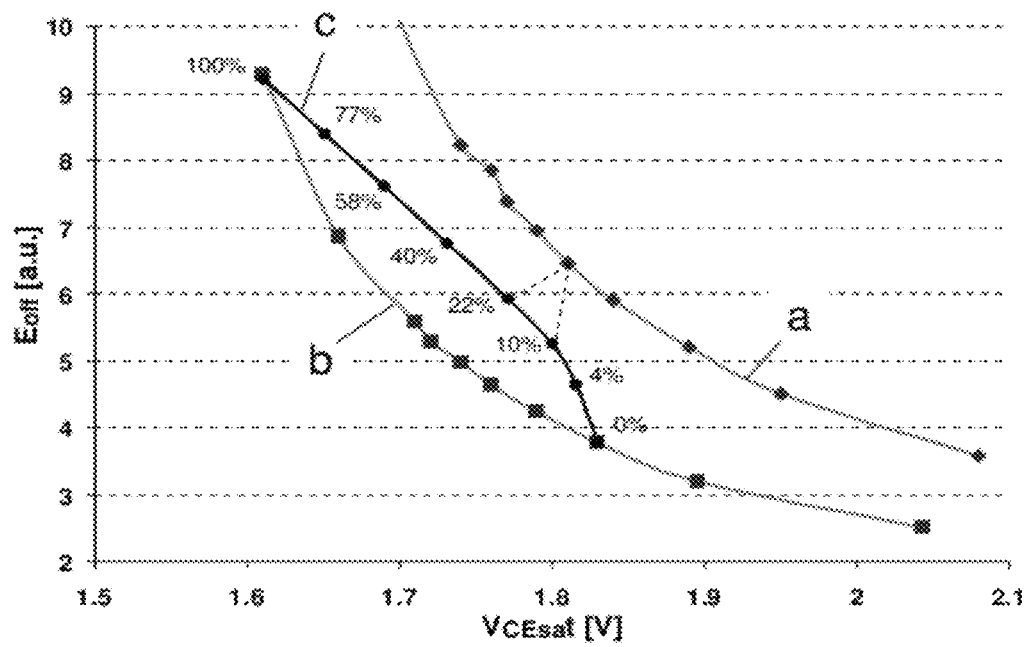
FIG. 8 schematically illustrates switching-off losses as function of saturation voltage of IGBT-modules according to one or more embodiments.

FIG. 8 schematically illustrates switching-off losses as function of saturation voltage of IGBT-modules according to one or more embodiments. Curves a and b were obtained in a device simulation and correspond to individual IGBTs. Curves a and b also correspond to IGBT modules of respective identical individual IGBTs which are connected in parallel. The individual vertical IGBTs corresponding to curves a and b are at a given saturated collector emitter voltage $V_{CEsat}$ identical except for the vertical extension of the drift region which is larger for the individual vertical IGBTs corresponding to curves a. In the simulation, $V_{CEsat}$ was varied by changing the doping concentration of the respective collector regions. Due to the different vertical extension of the drift regions, the IGBTs corresponding to curve a shows a better reverse-recovery behavior, i.e. a better switching-off softness, than the IGBTs corresponding to curve b. However, the switching-off losses are significantly lower for the IGBTs corresponding to curve b. This illustrates that there is a trade-off relationship between switching-off losses, $V_{CEsat}$ and softness of IGBT-modules.

Curve c corresponds to an IGBT module with two different portions or fractions of IGBTs connected in parallel. This means that the IGBT modules corresponding to points on curve c include a first individual IGBT or a first IGBT group of identical first individual IGBTs and a second individual IGBT or a second IGBT group of identical second individual IGBTs. The first individual IGBT or the first IGBT group is configured to carry a first portion or fraction of the load current of the IGBT module. Likewise, the second individual IGBT or the second IGBT group is configured to carry a second portion or fraction of the total load current of the IGBT module. For example, the first individual IGBT has an active area for carrying load currents with a size that differs from the size of the active area of the second individual IGBT. Due to the different size of the respective active areas, the first and second IGBTs can be configured to carry a different portion of the total load current of the IGBT module. Likewise, the size of the total active area of the first IGBT group can differ from the size of the total active area of the second IGBT group. For example, the size of the active area of the individual IGBTs is equal for the IGBTs of both IGBT groups, but the number of IGBTs in the two IGBT groups is different.

The IGBT modules represented by curve c include different portions of first individual IGBTs represented the point on curve b with the lowest $V_{CEsat}$ of about 1.65V and second individual IGBTs represented the point on curve b with $V_{CEsat}$ of about 1.8V. The percentages of the points on curve c relate to the percentage of the total active area of the first individual IGBTs. At given $V_{CEsat}$, the IGBT modules represented by curve a can have a better softness but an increased loss $E_{off}$ compared to IGBT modules represented by curve c. Compared to IGBT modules represented by curve a, IGBT modules represented by curve c can have, at given $V_{CEsat}$, lower losses $E_{off}$ at substantially the same or only a slightly reduced softness. For example, a detailed analysis of the reverse-recovery behavior reveals that the softness corresponding to an IGBT module with a $V_{CEsat}$ of about 1.8 V on curve a and the softness of an IGBT module corresponding to curve c with percentages of 10% and 22% are almost identical. This is indicated by the dashed lines in FIG. 8. Accordingly, combining two IGBTs with different softness and/or different $V_{CEsat}$ may result in a better trade-off relationship between softness and switching losses. Note that the switching losses of the IGBT module with $V_{CEsat}$ of about 1.8 V on curve a are much higher.

Softness of IGBT modules represented by points on curve c with a percentage which is larger than about 10%, i.e. an ratio of the size of the total active areas of more than about 0.1, have a very good softness. In other words, good softness for the considered IGBT types can be achieved by IGBT modules which are configured such that about 10% or more of the total load current of the IGBT module is, at rated current, carried by IGBTs of lower saturation voltage, e.g. of higher doped collector region. The first individual IGBTs in the embodiment of FIG. 8 have also a better softness than the second individual IGBTs. In other words, at least about 10% of the total load current of the IGBT module can be, at rated current, carried by IGBTs of better softness. The softness factor of the first individual IGBTs can be at least 10% higher than the softness factor of the second individual IGBTs.

The trade-off relationship between softness and switching losses may be balanced depending on application. IGBT modules represented by points on curve c can be between a percentage of about 5% to about 95%, e.g. between 10% and 60% and can have a particularly good trade-off relationship between softness and switching losses.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An IGBT module, comprising:
a first IGBT comprising a first semiconductor substrate, a collector electrode, a gate electrode, an emitter electrode, a collector-side transistor formed in the first substrate, and a collector region of a first conductivity type and of a first doping concentration and in ohmic contact with the collector electrode, the collector-side transistor having a first gain factor which corresponds to the first doping concentration; and
a second IGBT comprising a second semiconductor substrate that is separate from the first semiconductor substrate, a collector electrode electrically connected to the collector electrode of the first IGBT, a gate electrode electrically connected to the gate electrode of the first IGBT, an emitter electrode electrically connected to the emitter electrode of the first IGBT a collector-side transistor formed in the second substrate, and a collector region of the first conductivity type and of a second doping concentration different than the first doping concentration and in ohmic contact with the collector electrode of the first IGBT, the collector-side transistor of the second IGBT having a second gain factor which corresponds to the second doping concentration and is different than the first gain factor,
wherein the first and second doping concentrations differ by at least 20% so that the first and second gain factors differ by more than expected from manufacturing variations and variations due to aging processes.

2. The IGBT module of claim 1, wherein the first and second gain factors differ by more than 10%.

3. The IGBT module of claim 1, wherein the total number of first and second IGBTs is larger than 2.

4. The IGBT module of claim 1, wherein the first doping concentration exceeds the second doping concentration by at least 50%.

5. The IGBT module of claim 1, wherein the first IGBT comprises a drift region of a second conductivity type, and wherein the second IGBT comprises a drift region of the second conductivity type and of a doping concentration which differs from a doping concentration of the drift region of the first IGBT by at least 25%.

6. The IGBT module of claim 1, wherein a first minimum distance is between the emitter electrode and the collector region of the first IGBT, and wherein a second minimum distance is between the emitter electrode and the collector region of the second IGBT, the first and second minimum distances being different by at least 5%.

7. The IGBT module of claim 1, wherein the first IGBT a drift region of a second conductivity type and a field-stop layer of the second conductivity type arranged between the collector region and the drift region, the field-stop layer having a doping concentration higher than a doping concentration of the drift region.

8. The IGBT module of claim 7, wherein the second IGBT comprises a drift region of the second conductivity type and a field-stop layer of the second conductivity type arranged between the collector region and the drift region and having a doping concentration higher than a doping concentration of the drift region of the second IGBT and different than the doping concentration of the field-stop layer of the first IGBT by at least 10%.

9. The IGBT module of claim 1, wherein the first and second collector-side transistors are pnp-transistors.

10. The IGBT module of claim 1, wherein a first saturation voltage is between the collector electrode and the emitter electrode of the first IGBT, and wherein a second saturation voltage is between the collector electrode and the emitter electrode of the second IGBT, the second saturation voltage being higher than the first saturation voltage.

11. The IGBT module of claim 10, wherein the first IGBT comprises a pn-junction arranged next to its collector electrode and having a first area, and wherein the second IGBT comprises a pn-junction arranged next to its collector electrode and having a second area, a size ratio between the first area and the second area being larger than about 0.1.

12. The IGBT module of claim 1, wherein the first IGBT comprises an active area operable to carry a first part of a load current of the IGBT module, and wherein the second IGBT comprises an active area operable to carry a second part of the load current of the IGBT module, the size of the active area of the first IGBT ranging from about 5% to about 2000% of the size of the active area of the second IGBT.

13. A circuit, comprising:
at least two individual power IGBTs connected in parallel, a first one of the at least two individual power IGBTs comprising a collector-side pnp-transistor having a collector region of a first conductivity type and of a first doping concentration and a first gain factor which corresponds to the first doping concentration, and a second one of the at least two individual power IGBTs comprising a collector-side pnp-transistor having a collector region of the first conductivity type and of a second doping concentration different than the first doping concentration and a second gain factor which corresponds to the second doping concentration and is lower by at least 10% than the first gain factor of the collector-side pnp-transistor of the first IGBT,
wherein the at least two individual power IGBTs are disposed on separate semiconductor substrates,
wherein the first and second doping concentrations differ by at least 20% so that the first and second gain factors differ by more than expected from manufacturing variations and variations due to aging processes.

14. The circuit of claim 13, wherein the first individual power IGBT comprises an n-type drift region as part of the collector-side pnp-transistor of the first individual power IGBT, wherein the second individual power IGBT comprises an n-type drift region as part of the collector-side pnp-transistor of the second individual power IGBT, and wherein a doping concentration of the drift region of the second individual power IGBT differs from a doping concentration of the drift region of the first individual power IGBT by at least 25%.

* * * * *